United States Patent
Cole et al.

(10) Patent No.: US 7,329,895 B2
(45) Date of Patent: Feb. 12, 2008

(54) DUAL WAVELENGTH DETECTOR

(75) Inventors: Barrett E. Cole, Bloomington, MN (US); Wei Yang, Minnetonka, MN (US); Thomas E. Nohava, Apple Valley, MN (US)

(73) Assignee: Honeywell International Inc., Morristown, NJ (US)

( * ) Notice: Subject to any disclaimer, the term of this patent is extended or adjusted under 35 U.S.C. 154(b) by 306 days.

(21) Appl. No.: 10/081,369

(22) Filed: Feb. 22, 2002

(65) Prior Publication Data

US 2003/0160231 A1 Aug. 28, 2003

(51) Int. Cl.
- H01L 29/06 (2006.01)
- H01L 31/0328 (2006.01)
- H01L 31/0336 (2006.01)
- H01L 31/072 (2006.01)
- H01L 31/109 (2006.01)

(52) U.S. Cl. ......... 257/22; 257/E25.006; 257/E31.022; 257/E31.061; 257/E31.123

(58) Field of Classification Search ............... 257/432, 257/440; 359/104–195
See application file for complete search history.

(56) References Cited

U.S. PATENT DOCUMENTS 5,144,397 A * 9/1992 Tokuda et al. ............... 357/30
5,550,373 A * 8/1996 Cole et al. ............... 250/338.1
5,892,222 A 4/1999 Elabd ...................... 250/226
5,909,280 A 6/1999 Zavaracky ................ 356/352
5,959,299 A 9/1999 Castro et al. .......... 250/339.15
6,407,439 B1 * 6/2002 Hier et al. ................. 257/440
6,459,484 B1 * 10/2002 Yokoi ......................... 356/318
6,483,116 B1 * 11/2002 Kozlowski et al. ......... 250/372

FOREIGN PATENT DOCUMENTS

EP 0347563 12/1989
WO WO-00/57485 9/2000

OTHER PUBLICATIONS

Yoo, Y.S. ,et al. , "High-resolution cavity ringdown spectroscopy with a Fabry-Perot etalon at the cavity output", *Chemical Physics Letters*, 330, (2000), pp. 528-534.

* cited by examiner

*Primary Examiner*—Howard Weiss
(74) *Attorney, Agent, or Firm*—Kris T. Fredrick

(57) ABSTRACT

A sensor comprises two photodiodes sensitive to different wavelengths. The photodiodes or detectors are stacked in a vertical relationship to each other. A bandpass filter is provided to limit the wavelengths of light reaching the detectors. The photodiodes are formed of various combinations of materials such as AlGaN or InGaN, or different compositions of the same material. Charge detectors are coupled to each detector to provide a signal representative of the amount of radiation detected in their corresponding bandwidths. A biological sample is provided proximate the filter. A laser is used to illuminate the biological sample to create biofluorescence corresponding to intrinsic tryptophan of bacteria.

25 Claims, 8 Drawing Sheets

DUAL WAVELENGTH DETECTOR

The Government may have rights in this invention pursuant to Contract No. N00014-00-C-0407, awarded by the Department of the Navy.

INCORPORATION BY REFERENCE

Co-pending commonly assigned U.S. patent application Ser. No. 09/275,632, to Wei Yang et al., filed Mar. 24, 1999, and entitled "BACK-ILLUMINATED HETEROJUNCTION PHOTODIODE" is hereby incorporated by reference.

FIELD OF THE INVENTION

The present invention relates to light sensors, and in particular to a detector for at least two wavelength bands such as infrared and visible color wavelengths.

BACKGROUND OF THE INVENTION

Optical filters are commonly used in a wide variety of applications. For example, optical filters are used to provide separate optical "channels" in optical fiber networks. Optical filters are also used to monitor the spectral emission from the power plants and engines to provide a level of combustion monitoring and control. Optical filters can also be used in biological particle identification systems to provide spectral resolution of the fluorescence needed for high levels of discrimination of biological materials. These are just a few of the many applications for optical filters.

Many optical filters are formed from thin films that reflect or transmit a narrow band of wavelengths. In many cases, such filters are constructed from several hundred layers of stacked narrow band filters, which collectively reflect or transmit a narrow band of wavelengths. Arrayed waveguide gratings are also commonly used. A limitation of many of these filters is that they are not wavelength tunable. That is, the operative wavelength cannot be dynamically changed during operation to select a different optical wavelength.

Biological or inorganic particle identification systems identify the size and class of particles in air via scattered light and intrinsic ultraviolet fluorescence measurements. These system are useful as early warning sensors in biological warfare (BW) agent attacks either in an urban area or on a battlefield. Present day systems, such as a fluorescence aerodynamic particle sizer are large and power hungry, and are not portable. Smaller and more lightweight systems are desired for both portable applications and for incorporation into larger, more complex systems for building protection and battlefield BW agent detection systems.

Optical filters are combined with detectors for measuring the amount of fluorescence passing through the filters. Some detectors have a limited bandwidth of detection that is not as great as the bandwidth desirably passed by the filter. There is a need for an improved detector that can detect a larger bandwidth passed by the filter.

SUMMARY OF THE INVENTION

A sensor comprises two photodiodes sensitive to different wavelengths. In one embodiment, the photodiodes or detectors are stacked in a vertical relationship to each other. A bandpass filter is provided to limit the wavelengths of light reaching the detectors.

In one embodiment, the detectors are sensitive to adjacent lower and higher bands of wavelengths. The wavelengths range from approximately 250 to 390 nanometers, with a first detector absorbing radiation in the range of approximately 250 to 300 nanometers, with a second stacked detector absorbing radiation in the range of approximately 290 to 390 nanometers.

The photodiodes are formed of various combinations of materials, the proportions of which are modified to change the wavelength they absorb. In one embodiment, the photodiodes are formed of AlGaN or InGaN. Reducing the mole fraction of Al, increases the wavelength absorbed or detected by the detector. Further increases in wavelength are obtained by using InGaN. Each of these compositions has compatible lattice constants. Each photodiode is formed of either a different material, or the same material with different compositions for different wavelengths.

In a further embodiment, charge detectors are coupled to each detector to provide a signal representative of the amount of radiation detected in their corresponding bandwidths. A biological sample is provided proximate the filter. A laser is used to illuminate the biological sample to create biofluorescence corresponding to intrinsic tryptophan of bacteria.

In one embodiment, the sensor includes a tunable bandpass filter, a pair of detectors, and readout electronics, each supported by a different substrate. The substrates are secured relative to one another to form the sensor. The readout electronics are electrically connected to one or more electrodes of the detector through, for example, one or more bump bonds. The readout electronics provide a signature of the biological sample which is compared to known signatures to identify the composition of the sample.

DETAILED DESCRIPTION OF THE INVENTION

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
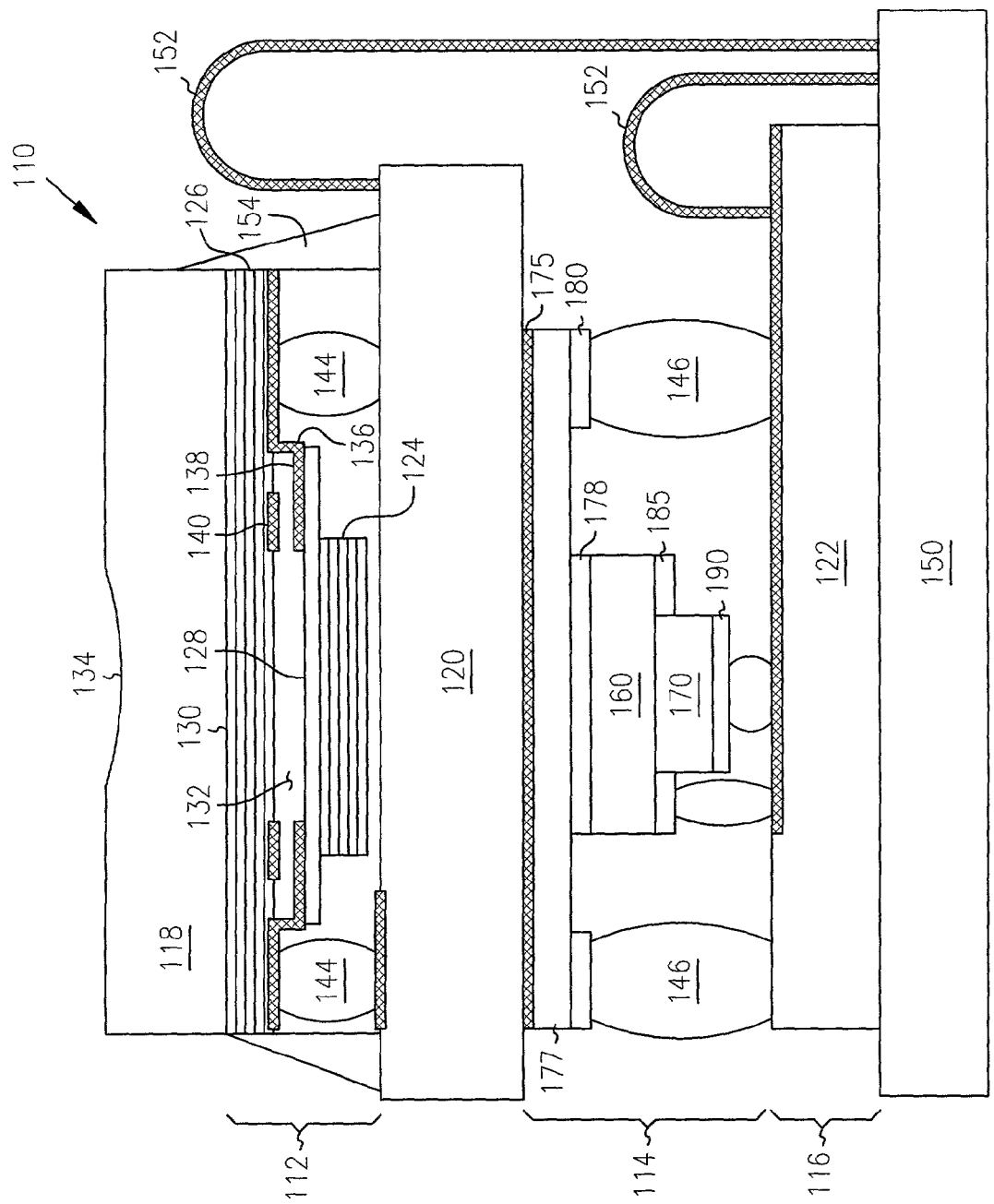
FIG. 1 is a sectional representation of a sensor having a dual stacked optical detector and filter.

FIG. 1 is a schematic cross-sectional side view of an illustrative tunable bandpass detector 110 in accordance with the present invention. The illustrative tunable bandpass detector 110 includes a tunable bandpass filter 112, a multiple frequency detector 114 and readout electronics 116, each supported by a different substrate. For example, the tunable bandpass filter 112 is supported by a first substrate 118, the detector 114 is supported by a second substrate 120, and the readout electronics 116 are supported by a third substrate 122.

In the illustrative embodiment, the tunable bandpass filter 112 includes a Micro Electro Optical Mechanical System (MEOMS) etalon. The MEOMS includes a top plate 124 and a bottom plate 126. The bottom plate 126 corresponds to the first substrate 118, or other layers provided on the first substrate 118, as desired. Both the top plate 124 and the bottom plate 126 are optionally adapted to include a reflective region. In FIG. 1, the top plate includes a reflective region 128, which includes a Distributed Bragg reflector in one embodiment that includes a semiconductor and/or dielectric mirror stack. Likewise, the bottom plate 126 includes a reflective region 130, which also includes a Distributed Bragg reflector that further includes a semiconductor and/or dielectric mirror stack.

The top plate 124 and the bottom plate 126 are separated by a separation gap 132 to form a Fabry-Perot cavity. To selectively tune the tunable bandpass filter 112 to a desired bandpass wavelength, the top plate is pulled toward the bottom plate 126, which changes the separation gap 132. The range of movement of the top plate 124 relative to the bottom plate 126 determines the spectral range of the wavelengths that can be selected. In some embodiments, a lens 134 is positioned adjacent the tunable bandpass filter 112 to help direct and/or shape the incoming light beam. The purpose of filter 112 is to provide a bandpass filter function to ensure only a limited bandwidth of light is passed through to the detector. Significant light outside the desired range of the detector would have an adverse effect on the accuracy and reliability of the detector. The bandpass filter may also be constructed in any other manner desired to provide such function.

In one embodiment, the top plate 124 is suspended above the bottom plate 126 by one or more supporting legs or posts 136. In addition, one or more top electrodes 138 are mechanically coupled to the top plate 124, and one or more bottom electrodes 140 are mechanically coupled to the bottom plate 126. When an electric potential is applied between corresponding top electrodes 138 and bottom electrodes 140, an electrostatic force is generated to pull the top plate 124 toward the bottom plate 126. This changes the separation gap 132 of the Fabry-Perot cavity. In some embodiments, the electrostatic force causes the top plate 142 to deform, which provides the movement of the reflective region 128 of the top plate 124 relative to the bottom plate 126.

The detector 114 is disposed adjacent the tunable bandpass filter 112, and receives the one or more wavelengths that are passed through the tunable bandpass filter 112. Preferably, the detector 114 is sensitive to the entire spectral range of wavelengths that can be passed through the tunable bandpass filter 112. In an illustrative embodiment, the detector 114 is a modified form of AlGaN PIN photodiode, such as described in co-pending commonly assigned U.S. patent application Ser. No. 09/275,632, to Wei Yang et al., filed Mar. 24, 1999, and entitled "BACK-ILLUMINATED HETEROJUNCTION PHOTODIODE" which is hereby incorporated by reference at least for its teaching of the method of constructing the detector. Such detector is modified to include two stacked photodiodes 160 and 170 for detecting different wavelength energy.

In the embodiment shown in FIG. 1, the tunable bandpass filter 112 is supported by the first substrate 118, and the detector 114 is supported by a second substrate 120. The first and second substrates are preferably substantially transparent to the expected spectral range of wavelengths. In one illustrative embodiment, the first substrate is Pyrex and the second substrate is sapphire. The first and second substrates are secured together in a front-to-back fashion, as shown in FIG. 1. That is, the front side of the first substrate 118 is provided adjacent to the back side of the second substrate 120. Bump bonds 144 or the like are used to secure the first substrate 118 to the second substrate 120, and to make any electrical connection there between, as desired. A dielectric seal 154 is provided in one embodiment as shown to protect the tunable bandpass filter 112. In some embodiments, the dielectric seal 154 provides a vacuum seal. Arranged in this manner, the wavelengths of interest pass, in sequence, through the first substrate 118, the bandpass filter 112, and the second substrate 120, before reaching the detector 114.

Readout electronics are optionally provided on a third substrate 122 or in the form of other discrete circuitry. The readout electronics are fabricated using conventional integrated circuit processing techniques. For example, the readout electronics may be fabricated using a CMOS process on a silicon substrate 122. Metal pads may be provided to provide electrical connections to the detector 114. In the embodiment shown in FIG. 1, bump bonds 146 are used to electrically connect one or more electrodes of the detector 114 to corresponding metal pads of the readout electronics. The bump bonds may also be used to secure the third substrate 122 relative to the second substrate 120, as shown. The third substrate may be mounted to a package 150, if desired. In the illustrative embodiment, multiple bond wires 152 are used to connect selected package pins to the readout electronics and the electrodes of the tunable bandpass filter 112, as shown. Further bond wires are provided as needed.

The photodiodes 160 and 170 of the detector 114 are formed of AlGaN/InGaN, or different compositions of AlGaN or InGaN. Photodiode 160, closer to the sapphire substrate 120 has a higher Al mole fraction and absorbs and detects short wavelengths. The second photodiode 170 is formed with a lower Al mole fraction, or a low In content and absorbs relatively longer wavelengths.

In one embodiment, photodiode 160 is an absorber for wavelengths of approximately 250-300 nanometers, and photodiode 170 absorbs wavelengths of 290 to 390 nanometers. Thus, radiation between 250 and 390 nanometers is detected by the detector 114.

Prior to forming photodiode 160, a buffer layer 175 is formed on the sapphire substrate 120. This layer is approximately 500 angstrom in one embodiment and provides an epitaxial matching function to facilitate formation of the detector. The detector is formed by starting with an n doped $Al_xGa(1-x)N$ layer 177, followed by an i doped $Al_yGa(1-y)N$ layer 178 and the photodiode layer 160 as described above. At least one n doped contact 180 is formed on layer 177, and a further p doped contact is formed on photodiode 160 to provide contact to circuitry formed on a further substrate. A further p doped contact 190 is formed on photodiode 170 for contact to such circuitry.

In a further embodiment, both photodiodes are formed of AlGaN compositions. A first has a composition that is responsive to short wavelengths (210-280 nanometers) and a second photodiode has a composition that is responsive to longer wavelengths (280-360 nanometers)

Figure 2:
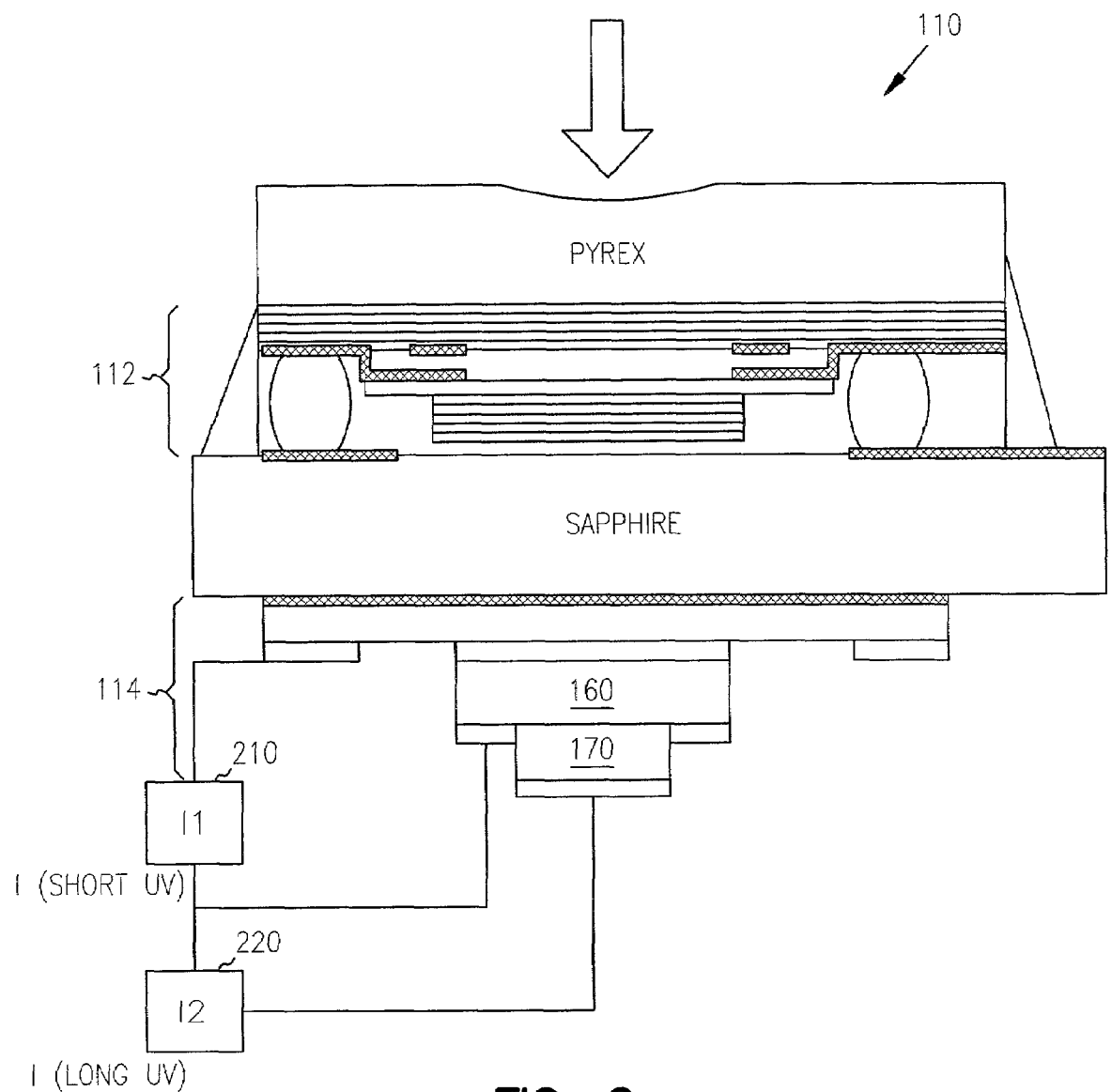
FIG. 2 is a sectional representation of the sensor of FIG. 1 and further including a block representation of charge detectors coupled to the dual stacked optical detector.

FIG. 2 is a combined cross section/block diagram of the bandpass detector with numbering consistent with that of FIG. 1. The photodiodes 160 and 170 are shown coupled to charge detection circuits 210 and 220 respectively. Charge detector 210 is coupled to photodiode 160 for detection of higher frequency energy. Charge detector 220 is coupled to photodiode 170 for detection of lower frequency energy. In one embodiment, the charge detectors are integrated into third substrate 122 in FIG. 1. The charge detectors comprise high impedance well know integrated circuits in one embodiment.

Figure 3:
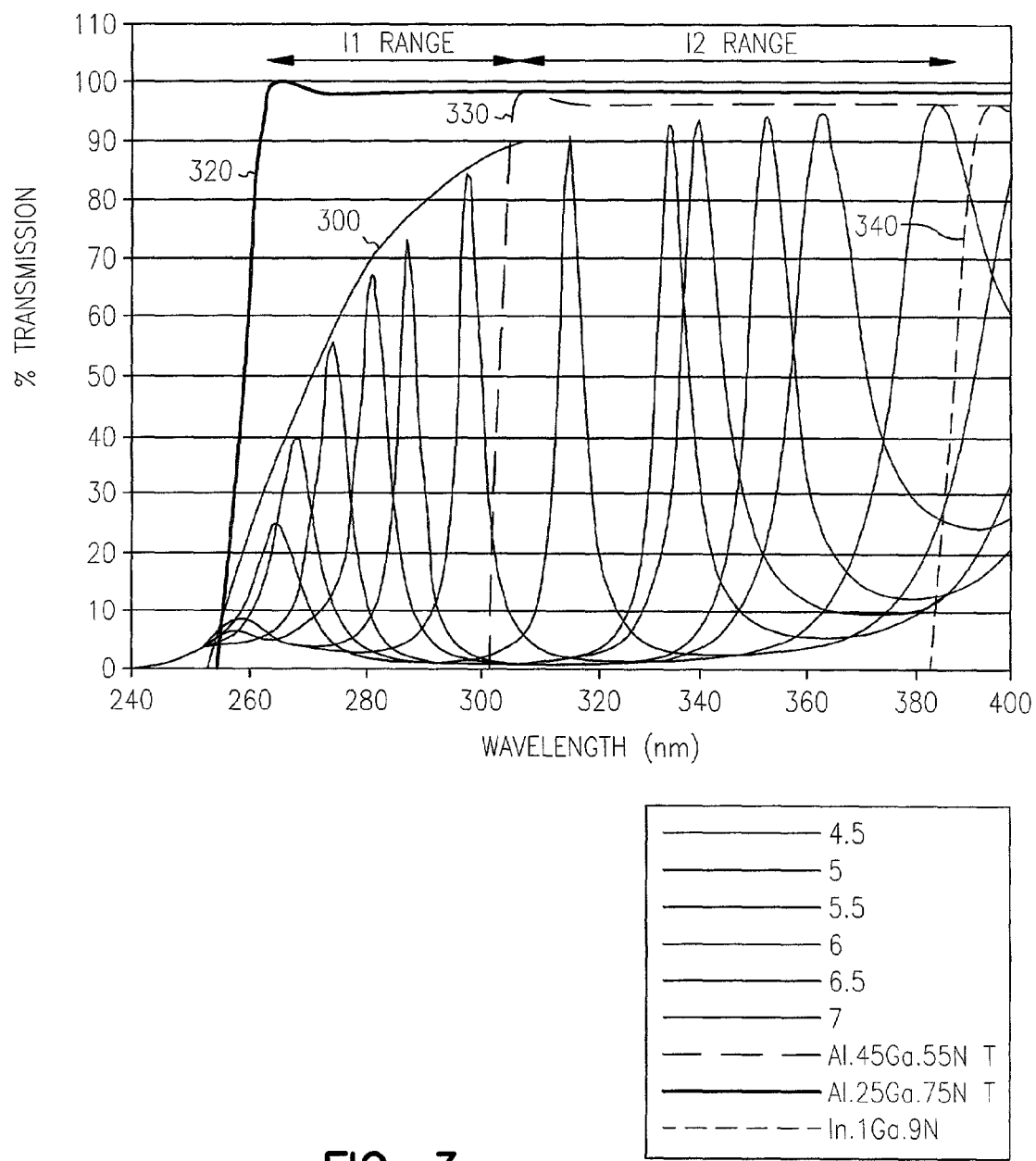
FIG. 3 is a graph showing example percent transmissions of the sensor of FIG. 1 versus incoming wavelength.

FIG. 3 is a graph showing the calculated percent transmission of the tunable filter of FIG. 1 versus incoming wavelength. The wavelength of the incoming light beam is shown across the bottom of the graph. The percentage of the incoming light that is transmitted through the bandpass filter is shown along the "y" axis for various etalon gap spacings.

A Pyrex absorption edge 300 is shown, which excludes wavelengths lower than approximately 260 nanometers. Three bands are shown corresponding to specific compositions of detectors. A first range indicated at 320 begins at approximately 260 nanometers and corresponds to a detector having a composition of Al.45Ga.55N T. A second range indicated at 330 begins at approximately 300 nanometers and corresponds to a detector having a composition of Al.25Ga.75N T. A third range indicated at 340 begins at approximately 380 nanometers and is comprised of In.1Ga.9N.

In one embodiment, the mole fractions for the above compositions are represented as $Al_xGa_{1-x}N$, $Al_yGa_{1-y}N$ where y<x, and InGaN or GaN. As seen above, decreasing the content or mole fraction of Al while increasing Ga results in sensitivity to higher wavelengths. Further, substituting In for Ga further increases the wavelength.

Figure 4:
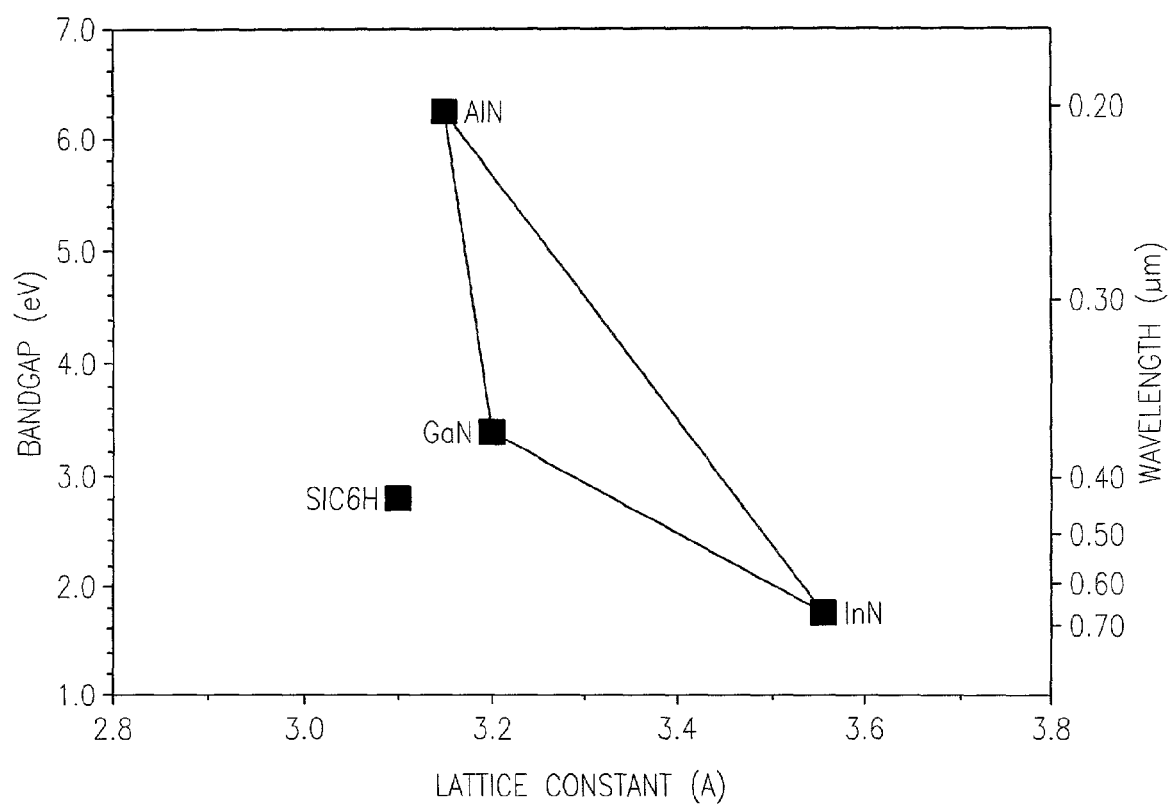
FIG. 4 is a graph showing lattice constant for varying mole fractions of elements comprising the dual stacked optical detector.

FIG. 4 shows a graph of different potential mole fractions for a detector. As the mole fraction is varied, the bandgap, lattice constant and sensitivity to different wavelengths shown in micrometers for each detector varies. The three substances shown in FIG. 4 include GaN, AiN and InN. The lattice constant is shown as varying between approximately 3.2 and 3.6. This range is compatible for formation of adjacent layers of material using well known semiconductor processing techniques. SiC6H is also shown as a material for a detector, having a slightly lower lattice constant. Further materials are also within the scope of the present invention.

Figure 5:
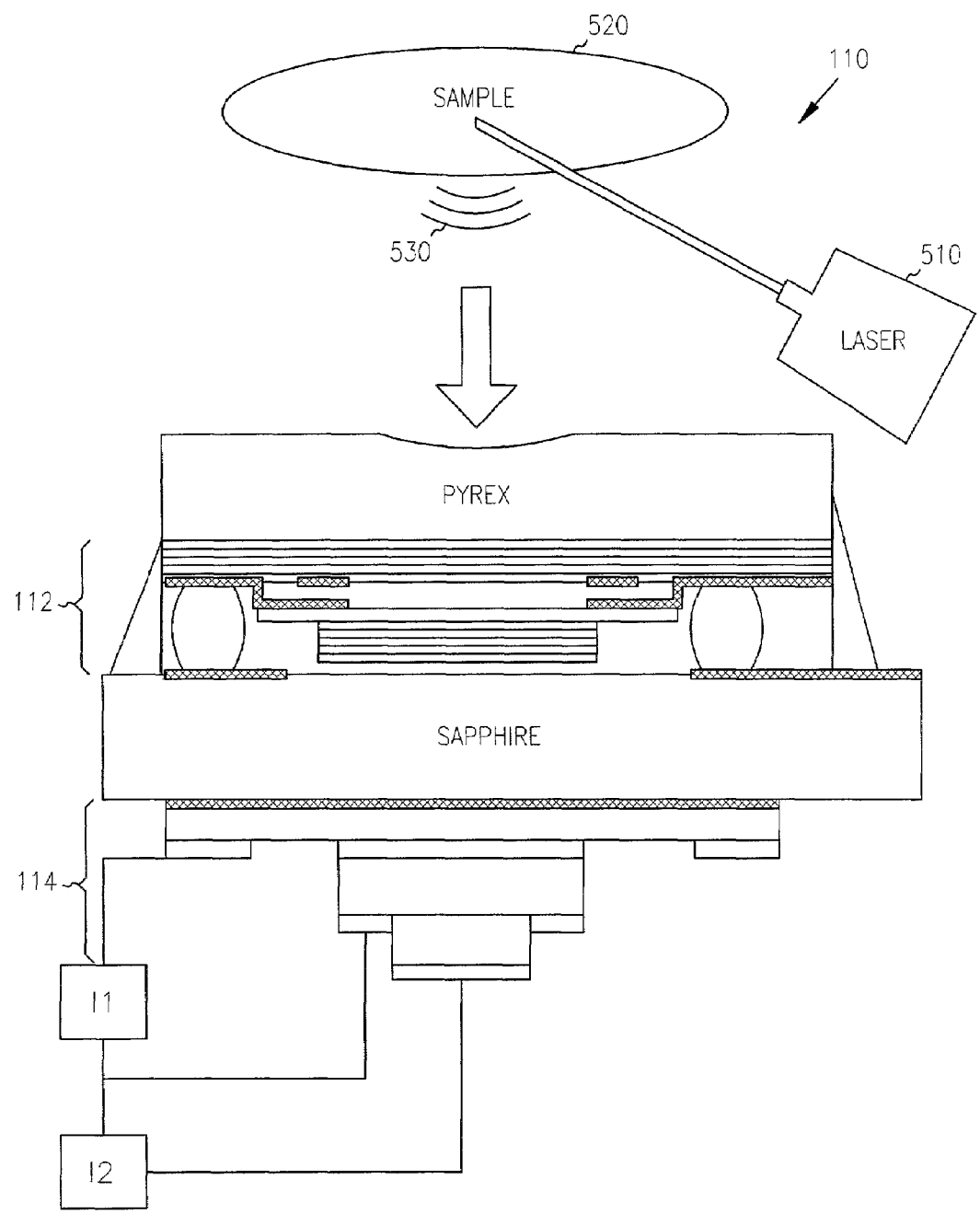
FIG. 5 is a sectional—block representation of the sensor of FIG. 1 including a sample and laser for fluorescing the sample.

In a further embodiment, an array of detectors is formed. The array comprises spectrally tunable ultraviolet detectors that utilize a grating-less miniaturized UV spectrometer integrating a MEMS (micro-electo-mechanical systems) etalon. The array is a solid state UV detector array. In FIG. 5, the array is represented by a single stacked detector. Both linear and two dimensional arrays of pixels are formed in various embodiments and are useful for obtaining spectral and spatial information.

Multiple detectors are easily formed on a substrate in parallel. The array of detectors is tuned to the intrinsic tryptophan related to luminance, scattered light or biofluorescence spectra of organisms such as bacteria and inorganic material. Substances having proteins or amino acids emit UV radiation by fluorescence caused from a in-band source 510 such as a laser, light emitting diode, ultraviolet source, or superluminescent diode in FIG. 5 illuminating a sample 520. The fluorescence is indicated at 530 and is directed toward one or more filters 112 and detectors 114, representing an array of detectors. In one example, the sample is a bacteria such as anthrax. Different samples emit a different signature that can be identified by experimentation on known samples. The detector detects signatures from unknown samples, which is then comparable to the identified signatures to identify the samples. In combination, the elements in FIG. 5 comprise a sensor useful in detecting biological warfare substances in a very quick manner.

Figure 6:
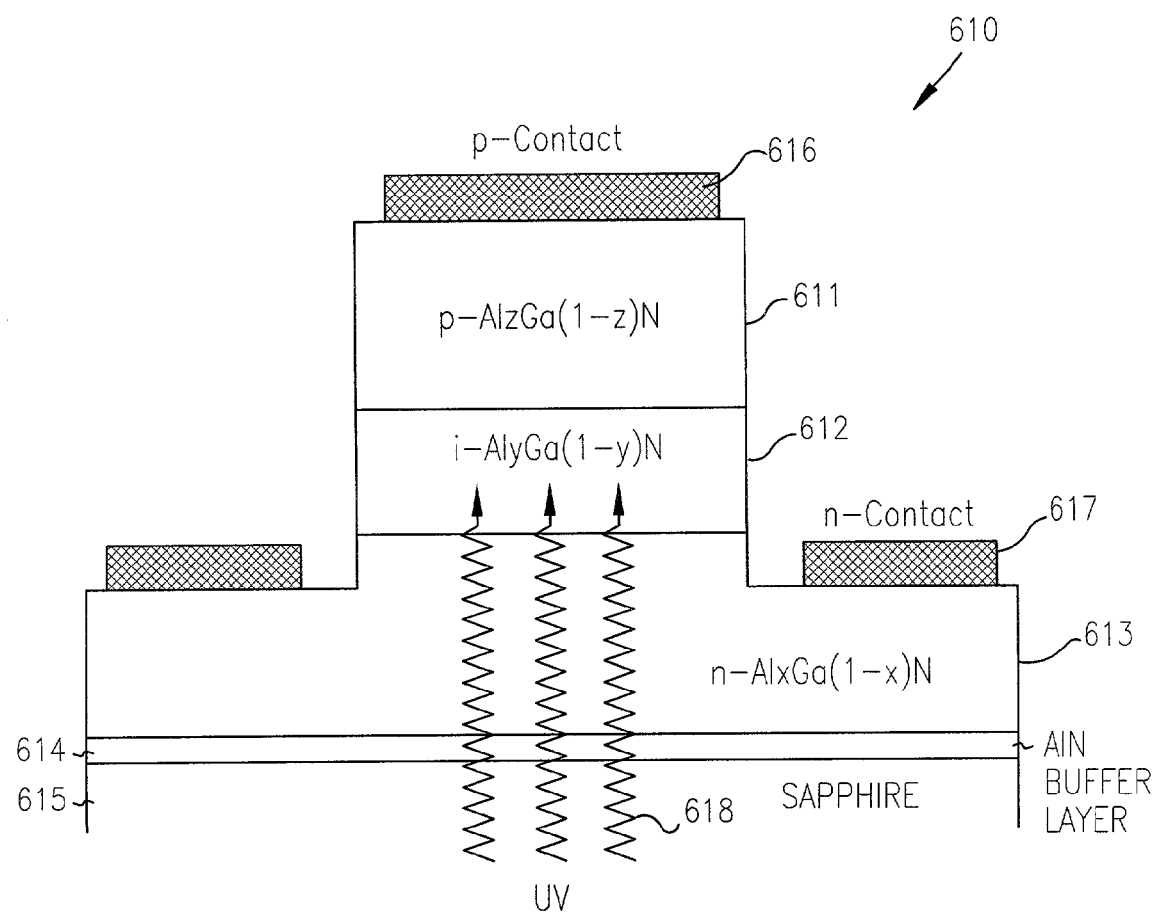
FIG. 6 is a cross section view illustrating formation of a first detector for the dual stacked optical detector of FIG. 1.

FIG. 6 shows further detail of the formation of the first detector. The second detector is formed in a similar manner on top of the first detector in one embodiment. As indicated above, the mole fractions of the elements are varied to obtain different wavelength sensitivities.

A cross-sectional view of the first detector is indicated at 610. An aluminum nitride (AlN) buffer layer 614 is formed on a sapphire substrate 615. The thickness of a substrate 615 is about 380 microns (15 mils) but may be another thickness, typically, between 200 and 500 microns (8 and 20 mils). The substrate starts out being part of a five-centimeter (two-inch) diameter wafer or other size wafer. The photo detector chip is cut at a size of 1.5 by 1.5 millimeter (mm) square. However, another convenient size is 0.3 mm by 0.3 mm. Sapphire is preferred because of its transparent characteristics to most of the UV wavelengths of interest. Materials such as silicon carbide are not transparent to all the of UV wavelengths, such as those less than 320 nanometers (nm). Buffer layer 614 is 25 nm (250 angstroms) thick but could have a thickness between 10 and 50 nm. Buffer layer 614 is for growing subsequent layer 613. This layer 614 is transparent to the entire UV spectrum.

Formed on layer 614 is an n-type aluminum gallium nitride (n-$Al_xGa_{(1-x)}N$) electrode layer 613. Layer 613 is transparent to the UV spectrum and yet is electrically conductive. A p-type layer is difficult to make both conductive and transparent to UV light. Layer 613 is silicon (Si) doped with $10^{17}$ to $10^{19}$ atoms per cubic centimeter (cm). This layer 613 is about 1.5 microns thick but could have a thickness set between 0.25 and 20 microns.

Formed on layer 613 is an aluminum gallium nitride (i-$Al_yGa_{(1-y)}N$) absorption layer 612, which is not doped. This layer 612 has a built-in electric field (even without a bias) wherein the negative and positive carriers are separated as soon as they are generated, and thus gives rise to a high-level field assisted collection of carriers. Layer 612 provides high internal efficiency in that virtually all of the holes and electrons generated in this layer contribute to the current measured. A loss of carriers reduces current. UV light of selected bandwidth 618 enters from the bottom side of substrate 615 and passes up through layer 613 and is absorbed by layer 612. wavelengths outside the selected bandwidth are passed through layer 612 and 611. The absorption by layer 612 eliminates the diffusion limited carrier transport (i.e., current) and thus results in efficient carrier collection. Since photo generation takes place apart from the surface at the interface of layers 612 and 613, and the interface of layer 613 and substrate 615, surface recombination is significantly reduced or actually avoided. Layer 612 is about 0.25 micron; however, a selected thickness may be between 0.1 and 5 microns.

Formed on layer 612 is a p-type aluminum gallium nitride (p-$Al_zGa_{(1-z)}N$) electrode layer 611. Layer 611 is doped with magnesium (Mg) at a density of $10^{17}$ to $10^{20}$ atoms per cubic cm. Layer 611 is about 0.5 micron thick but could have a thickness between 0.1 and 2 microns.

Layers 611 and 612 are etched on one side partially down into layer 613 to a fraction of a micron. An n-contact 617 is formed on the etched portion of layer 613. The first layer of contact 617 formed on layer 613 is about 50 nm of titanium (Ti). About 0.5 micron of aluminum is formed on the Ti. Contact 617 also serves as a contact for the second detector to be formed on top of the first detector. The aluminum layer may be up to several microns thick. On top of layer 611 is formed a p- contact 616. First, a layer of nickel is formed on layer 611. The thickness of the nickel may be between 10 and 500 nm. To complete contact 616, a layer of gold, having a thickness between 0.5 and 2 microns is formed on the nickel. The gold and nickel of contacts 616 and 617, respectively, are for bonding good electrical connections to photodiode 610.

The composition portions of Al and Ga for layers 611, 612 and 613 are indicated by z, y and x, respectively. There is an interrelationship of portions among these three layers. For instance, z is greater or equal to y, because if z<y then absorption would occur in layer 611. Also, x>y because if x≦y then the band pass of UV would be effectively eliminated by the absorption of layer 613 in that current would not be generated.

The second detector is formed prior to formation of contact 617. It is masked and etched to provide access to layer 613 to form contact 617.

Figure 7:
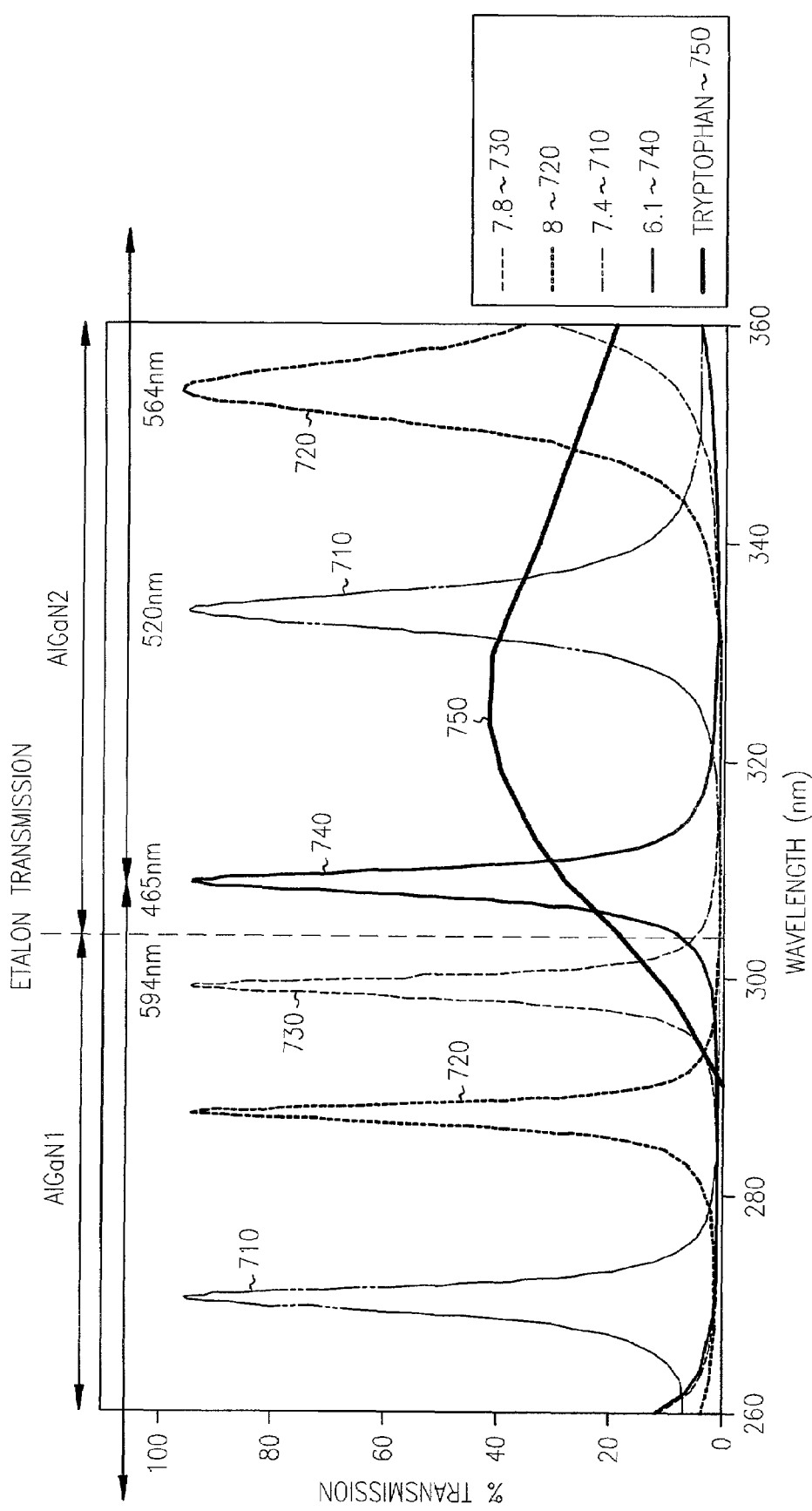
FIG. 7 is a graph showing the calculated percent transmission of an alternative sensor.

FIG. 7 is a graph showing the calculated percent transmission of a tunable filter using two different AlxGayN detectors versus incoming wavelength. The wavelength of the incoming light beam is shown across the bottom of the graph. The percentage of the incoming light that is transmitted through the bandpass filter is shown along the "y" axis at 710, 720, 730 and 740 for various quarter wave spacings of the etalon gap. Gap dimensions are shown above the transmitted light curves.

In example one it is desired to cover the major fluorescence of tryptophan spectra with a dual detector shown at 750. It is desired to cover the range from 260-360 or a fractional wavelength ratio change of 100 nm/310 nm=0.32. The etalon composed of a ZrO2/SiO2 mirror pair in the form of HLHLH will transmit the following spectra in two orders. The first detector is sensitive to the lower wavelengths (260 nm-310 nm) and transmits the longer UV wavelengths. The second detector behind the first detects the longer wavelengths (310 nm-360 nm) transmitted through the same etalon. Thus with these 2 detector signals it is possible to uniquely determine the full spectra in the 260-360 nm range. With a single detector, it is only possible to determine one of these two bands. A wider response detector (260 nm-360 nm), would not be able to discern whether the signal was from the short wave or long wave etalon transmission peak. The long wavelength response of each detector is determined by the band gap and the short wavelength response is defined by the transmission of the materials between the detector and the etalon. The band gap is defined by the Al/Ga ratio.

Figure 8:
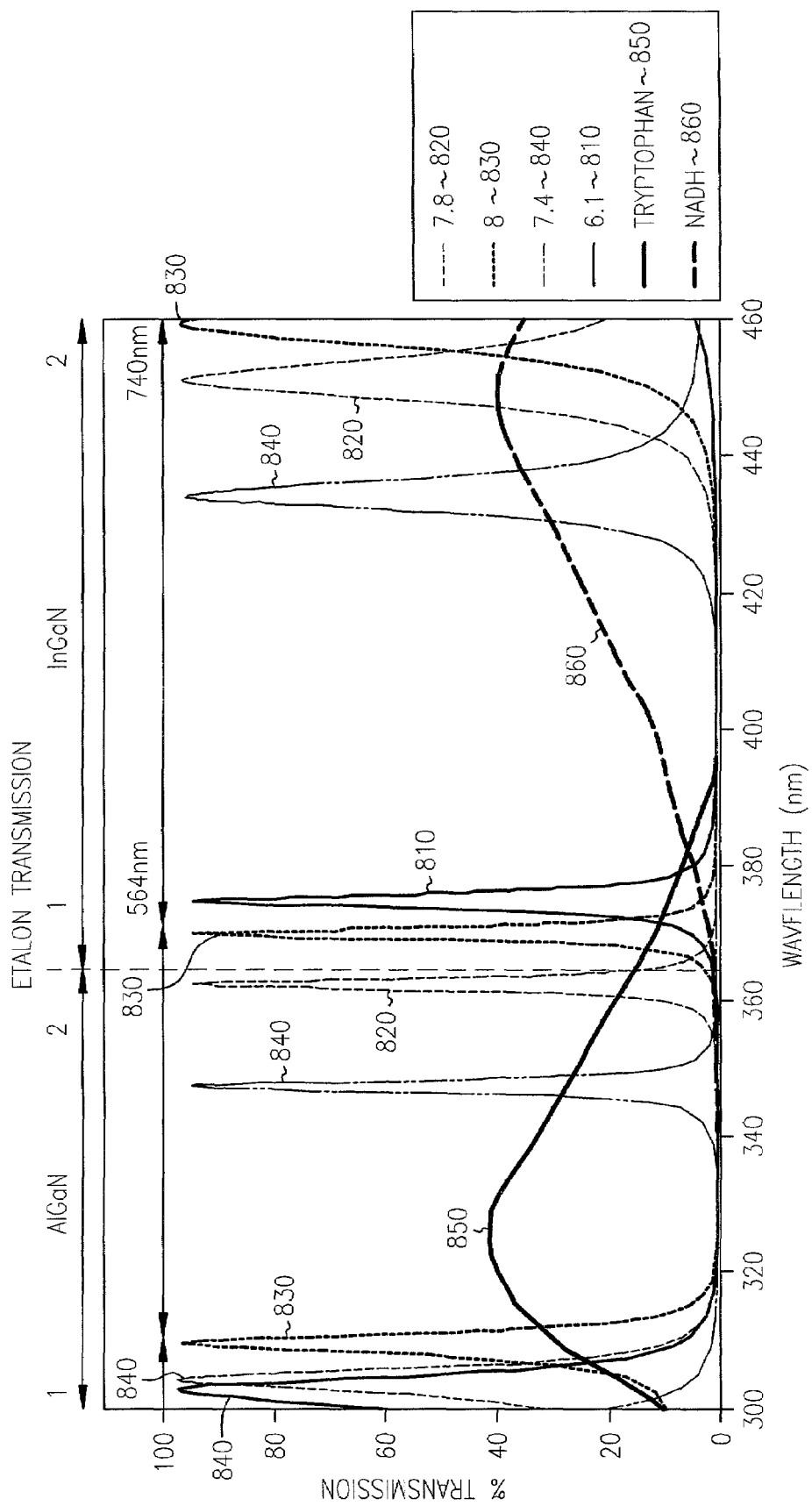
FIG. 8 is a graph showing the calculated percent transmission of a yet further alternative sensor.

FIG. 8 is a graph showing the calculated percent transmission of a tunable filter using an AlxGayN detector stacked with an InxGayN detector to measure tryptophan and NADH profiles. The wavelength of the incoming light beam is shown across the bottom of the graph. The percentage of the incoming light that is transmitted through the bandpass filter is shown along the "y" axis at 810, 820, 830 and 840 for various quarter wave spacings of the etalon gap. Gap dimensions are shown above the transmitted light curves.

In the second example a wider range of wavelengths is desired. It is desired to measure the fluorescence from 2 different biological signatures. The first band is tryptophan 850 and the second band is NADH 860. Such measurements can enhance biological discrimination. In this example two different detector materials are used to cover the wider range from 300 nm to 460 nm or a fractional wavelength change of 160 nm/380 nm=0.42. To cover this larger range it is necessary to use mirror materials that have high reflectance over a broader wavelength range. This requires using UV materials with a larger (high index/low index) ratio. Such dielectric mirror materials could be either diamond-like carbon or GaN combined with MgF2, all uv transparent. The etalon, as in example 1, transmits a number of wavelengths at each position. Once again the two different detectors are used to sort out the wavelength of the signal. From the selected curves of FIG. 2 it can be seen that a deconvolution of the etalon position information with the signal level from the 2 detectors can provide a unique assignment of the wavelength of the transmitted signal and thus a spectra.

The responsivity range of each of the 2 detectors is defined by adjusting the band gap by varying either the Al/Ga or In/Ga rations. The long wavelength response is determined by the band gap and the short wavelength response is defined by the transmission of the materials between the detector and the etalon.

The invention claimed is:

1. An optical sensor comprising:
    a bandpass filter;
    a first detector responsive to a low wavelength passed by the bandpass filter; and
    a second detector responsive to a high wavelength passed by the bandpass filter, wherein the low band and high band are adjacent bands of wavelengths, wherein the combined low band and high band are wider than can be detected by either the first or second detector.

2. The optical sensor of claim 1 wherein the detectors are formed in a stacked relationship.

3. The optical sensor of claim 1 wherein the bandpass filter comprises an adjustable band pass filter.

4. The optical sensor of claim 1 wherein the bandpass filter comprises a Fabry-Perot etalon.

5. The optical sensor of claim 1 wherein the detectors are respectively formed of $Al_xGa_{1-x}N$ and $Al_yGa_{1-y}N$ where y<x.

6. The optical sensor of claim 1 wherein the detectors are respectively formed of $Al_xGa_{1-x}N$ and InGaN.

7. The optical sensor of claim 1 wherein the first detector absorbs wavelengths of approximately 250 to 300 nanometers.

8. The optical sensor of claim 1 wherein the second detector absorbs wavelengths of approximately 290 to 390 nanometers.

9. The optical sensor of claim 1 wherein the detectors are formed on a sapphire substrate.

10. An optical sensor comprising:
    a bandpass filter;
    an in-band source that illuminates a sample proximate the bandpass filter;
    a first detector responsive to a low wavelength passed by the bandpass filter; and
    a second detector responsive to a high wavelength band passed by the bandpass filter wherein the wavelength bands are adjacent and overlapping, wherein the combined low band and high band are wider than can be detected by either the first or second detector.

11. The optical sensor of claim 10 wherein the in-band source is selected from the group consisting of laser, light emitting diode, ultraviolet source, and superluminescent diode.

12. The optical sensor of claim 10 wherein the detectors are formed on a sapphire substrate, and luminance from the sample passes through the sapphire substrate prior to being absorbed by the detectors.

13. The optical sensor of claim 10 and further comprising charge detectors coupled to the detectors.

14. The optical sensor of claim 13 and further comprising:
a first substrate;
a second substrate; and
a third substrate in which the charge detectors are formed.

15. The optical sensor of claim 14 wherein the third substrate comprises further circuitry associated with the charge detectors.

16. The optical sensor of claim 10 and further comprising:
a first substrate having the bandpass filter formed thereon;
a second substrate having the first and second detectors formed thereon.

17. The optical sensor of claim 16 wherein the first and second substrates are positioned such that first substrate is positioned between a biosample and the second substrate.

18. The optical sensor of claim 17 wherein the first and second substrates are coupled to each other by bump bonds.

19. The optical sensor of claim 10 wherein the bandpass filter comprises a Fabry-Perot etalon.

20. The optical sensor of claim 10 wherein the detectors are respectively formed of $Al_xGa_{1-x}N$ and $Al_yGa_{1-y}N$ where $y<x$.

21. The optical sensor of claim 10 wherein the detectors are respectively formed of $Al_xGa_{1-x}N$ and InGaN.

22. The optical sensor of claim 10 wherein the first detector absorbs wavelengths of approximately 250 to 300 nanometers and the second detector absorbs wavelengths of approximately 290 to 390 nanometers.

23. The optical sensor of claim 10 wherein the sample is inorganic, or a biosample.

24. An optical sensor comprising:
a bandpass filter supported on a glass substrate;
a first detector formed on a sapphire substrate responsive to a low wavelength band passed by the bandpass filter; and
a second detector formed on the first detector responsive to a high wavelength band passed by the bandpass filter, wherein the low wavelength band overlaps the high wavelength band, wherein the combined low band and high band are wider than can be detected by either the first or second detector.

25. An optical sensor comprising:
a bandpass filter;
an in-band source that illuminates a sample proximate the bandpass filter;
a first detector responsive to a low wavelength passed by the bandpass filter;
a second detector responsive to a high wavelength passed by the bandpass filter;
a first substrate having the bandpass filter formed thereon;
a second substrate having the first and second detectors formed thereon, wherein the first and second substrates are positioned such that first substrate is positioned between a biosample and the second substrate, and wherein the first and second substrates are coupled to each other by bump bonds.

* * * * *